United States Patent
Lee

(10) Patent No.: US 7,541,254 B2
(45) Date of Patent: Jun. 2, 2009

(54) METHOD OF MANUFACTURING THIN FILM CAPACITOR

(75) Inventor: Ki-Min Lee, Seoul (KR)

(73) Assignee: Dongbu Electronics Co., Ltd. (KR)

( * ) Notice: Subject to any disclaimer, the term of this patent is extended or adjusted under 35 U.S.C. 154(b) by 606 days.

(21) Appl. No.: 11/145,157

(22) Filed: Jun. 3, 2005

(65) Prior Publication Data

US 2005/0282348 A1 Dec. 22, 2005

(30) Foreign Application Priority Data

Jun. 7, 2004 (KR) .................... 10-2004-0041323

(51) Int. Cl.
*H01L 27/10* (2006.01)

(52) U.S. Cl. .................... 438/396; 257/393; 257/308; 438/254

(58) Field of Classification Search ............... 257/393, 257/308; 438/254, 240, 255
See application file for complete search history.

(56) References Cited

U.S. PATENT DOCUMENTS

| | | | |
|---|---|---|---|
| 6,103,622 A | 8/2000 | Huang | |
| 6,165,861 A | 12/2000 | Liu et al. | |
| 6,249,054 B1 | 6/2001 | Tanigawa | |
| 6,387,775 B1 | 5/2002 | Jang et al. | |
| 6,410,381 B2 | 6/2002 | Kim et al. | |
| 6,417,536 B2 * | 7/2002 | De Boer et al. | 257/309 |
| 6,492,224 B1 | 12/2002 | Jao | |
| 6,528,366 B1 | 3/2003 | Tu et al. | |
| 6,559,493 B2 | 5/2003 | Lee et al. | |
| 6,794,702 B2 | 9/2004 | Park | |

FOREIGN PATENT DOCUMENTS

| | | |
|---|---|---|
| KR | 2002-0030420 A | 4/2002 |
| KR | 2003-0072111 A | 9/2003 |

OTHER PUBLICATIONS

Yong Chan Kim; Semiconductor Device and Fabricating Method Thereof; Korean Patent Abstracts; Publication No. 10-2002-0030420-A, Apr. 25, 2002 (8 pages); Korean Intellectual Property Office, Korea.
Il Seok Han; Method for Manufacturing Analog Semiconductor Device Using Buffer Polysilicon Layer; Korean Patent Abstracts; Publication No. 10-2003-0072111-A, Sep. 13, 2003 (13 pages); Korean Intellectual Property Office, Korea.
Yung Pil Kim; Method of Fabricating MIM Capacitor; U.S. Appl. No. 11/027,838, filed Dec. 29, 2004; DongbuAnam Semiconductor Inc.
Yoo Seon Song; Methods of Fabricating Capacitor; U.S. Appl. No. 11/026,825, filed Dec. 28, 2004; DongbuAnam Semiconductor Inc.

* cited by examiner

*Primary Examiner*—Leonardo Andújar
(74) *Attorney, Agent, or Firm*—Andrew D. Fortney

(57) ABSTRACT

A first electrode layer having protrusions and depressions on its surface are formed on a lower insulating layer on a semiconductor substrate, and a sacrificial layer is formed on the first electrode layer with a material that is reflowable when heated. After reflowing the sacrificial layer by heat treatment, the reflowed sacrificial layer and first electrode layer are etched so that the protrusions of the first electrode layer are curved, and a dielectric layer and a second electrode layer are sequentially formed on the first electrode layer. When manufactured using the above method, a thin film capacitor may have higher capacitance without increasing the area of the electrode.

15 Claims, 6 Drawing Sheets

METHOD OF MANUFACTURING THIN FILM CAPACITOR

CROSS-REFERENCE TO RELATED APPLICATION

This application claims priority to and the benefit of Korean Patent Application 10-2004-0041323 filed in the Korean Intellectual Property Office on Jun. 07, 2004, the entire content of which is incorporated herein by reference.

BACKGROUND OF THE INVENTION (a) Field of the Invention

The present invention relates to a method of manufacturing a semiconductor device. More particularly, the present invention relates to a method of manufacturing a thin film capacitor having a metal-insulator-metal (MIM) structure.

(b) Description of the Related Art

Recently, in the field of high-speed analog circuitry, semiconductor devices for making a capacitor with high capacitance have been under development. Generally, when a capacitor has a PIP structure (where a polysilicon layer, an insulator layer, and a polysilicon layer are deposited), there is a disadvantage that, as the upper electrode and the lower electrode use conductive polysilicon, a natural oxide may be formed by oxidation at the interfaces between the electrodes and a dielectric thin film. Thus, total capacitance of the PIP device may be reduced.

To overcome this disadvantage, the structure of a capacitor has been changed to a metal-insulator-silicon (MIS) structure or a metal-insulator-metal (MIM) structure. Since an MIM capacitor has relatively low resistivity and no inner parasitic capacitance due to depletion therein, it is mainly used in high performance semiconductor devices.

FIG. 1 is a sectional view of a conventional thin film capacitor having an MIM structure. As shown in FIG. 1, this conventional thin film capacitor has a lower electrode 3 formed on a lower insulating layer 2 which is formed on a semiconductor substrate 1. In addition, an anti-reflective coating 4 is formed on the lower electrode 3, and a dielectric layer 5 and upper electrode 6 are sequentially formed on the anti-reflective coating 4. Here, the lower electrode 3 corresponds to a first electrode layer of the MIM capacitor, and the upper electrode 6 corresponds to a second electrode layer thereof.

In such a conventional MIM capacitor, the capacitance thereof depends in significant part on, e.g., an area of the upper electrode 6. Accordingly, to achieve high capacitance of an MIM device, the area of the electrode should be increased. However, in this case, it is difficult to achieve a highly integrated device (e.g., increasing the area of the MIM device reduces the number of devices per unit area).

In addition, manufacturing such an MIM device may be problematic. For example, a short circuit may be caused when the dielectric layer 5 is etched. In some cases, the lower electrode 3 may be etched together with the dielectric layer 5 and then re-deposited to sidewalls of the dielectric layer 5 and the upper electrode 6 ( phenomenon sometimes known as "back sputtering").

In addition, the capacitor characteristics may be deteriorated due to fringe (or parasitic) capacitance at the sidewalls of a conventional MIM capacitor, particularly as the height-to-width ration of the electrodes in such capacitors increases.

The information disclosed in this Background of the Invention section is only for enhancement of understanding of the background of the invention and therefore, unless explicitly described to the contrary, it should not be taken as an acknowledgement or any form of suggestion that this information forms prior art that is already known in this country to a person of ordinary skill in the art.

SUMMARY OF THE INVENTION

The present invention has been made in an effort to provide a method for manufacturing a thin film capacitor that is advantageous for higher integration of a device by increasing the capacitance without increasing an area of the electrode.

According to the present invention, short circuits possible using the conventional approach may be reduced or prevented, and capacitor characteristics (e.g., device capacitance) may be improved relative to the conventional MIM capacitor discussed above.

An exemplary method of manufacturing a thin film capacitor according to an embodiment of the present invention includes forming a first electrode layer having protrusions and depressions on its surface, forming a sacrificial layer on the first electrode layer with a material that can be reflowed by heat, reflowing the sacrificial layer by heat treatment, etching the reflowed sacrificial layer and first electrode layer so that the protrusions of the first electrode layer are curved, and sequentially forming a dielectric layer and a second electrode layer on the first electrode layer. Generally, the first electrode layer is on a lower insulating layer which is, in turn, on a semiconductor substrate A photoresist may be used as the sacrificial layer, and the heat treatment may be performed at a temperature of 150-300° C.

The etching may be performed such that an etch rate of the sacrificial layer and the first electrode layer is the same.

In one embodiment, etching may comprise plasma etching at a pressure of 8-13 mTorr, a source power of 900-1200 W, a bias power of 140-200 W, a flow rate of $Cl_2$ gas of 60-90 sccm, a flow rate of $BCl_3$ gas of 40-70 sccm, a flow rate of Ar gas of 30-50 sccm, and a flow rate of $CHF_3$ gas of 2-5 sccm.

The first electrode layer may be formed by forming (e.g., depositing) a thickness of the first electrode layer on the lower insulating layer, and selectively etching portions of the first electrode to form protrusions and depressions thereon to a depth less than the thickness of the first electrode layer.

In a further embodiment, the method of forming the first electrode layer may include sequentially forming a lower first electrode layer and an upper first electrode layer on the semiconductor substrate, and selectively etching portions of the upper first electrode layer until portions of the lower first electrode layer is exposed, such that the non-etched portions of the upper first electrode layer protrude from a non-exposed areas of the lower first electrode layer.

Furthermore, after the lower layer is formed, a liner metal layer may be formed on the lower first electrode layer and the lower insulating layer, and the upper first electrode layer may be formed on the liner metal layer.

The first electrode layer may comprise a first metal, metal alloy or conductive metal compound (e.g., a material selected from Al, Cu, W, Ti, and TiN).

The dielectric layer may comprise an oxide insulator (e.g., a material selected from $TiO_2$, $Al_2O_3$, and SiN), and may be deposited conformally onto the curved first electrode (e.g., it may be formed in a manner reflecting, reproducing or retaining the surface shape of the first electrode layer).

The second electrode layer may comprise a second metal, metal alloy or conductive metal compound (e.g., a material selected from Ru, Pt, and TiN), and it may also be deposited conformally onto the dielectric layer (e.g., it may be formed in a manner reflecting, reproducing or retaining the surface shape of the layer dielectric layer).

DETAILED DESCRIPTION OF THE PREFERRED EMBODIMENTS

Hereinafter, an embodiment of the present invention will be described in detail with reference to the accompanying drawings.

Figure 1:
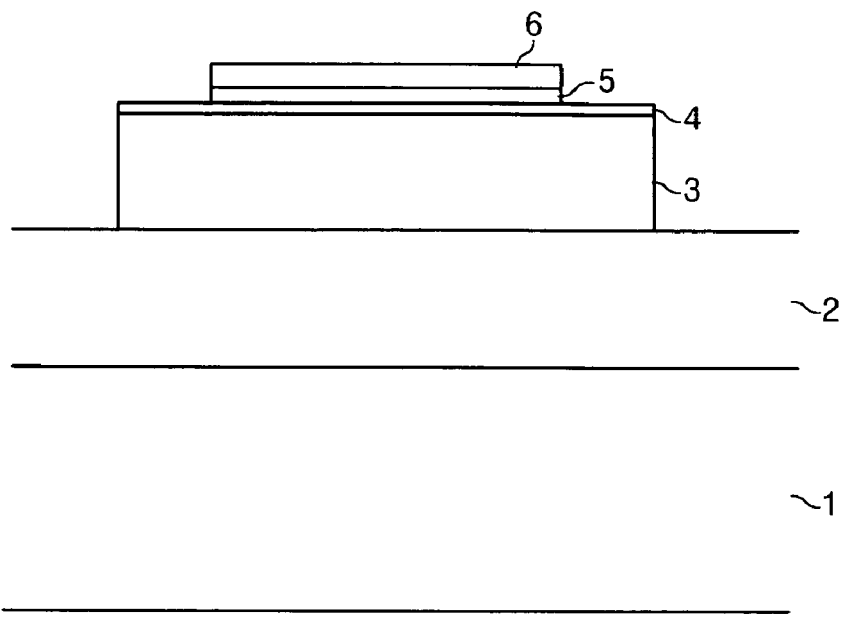
FIG. 1 is a sectional view of a configuration of a conventional thin film capacitor.
Figure 2A:
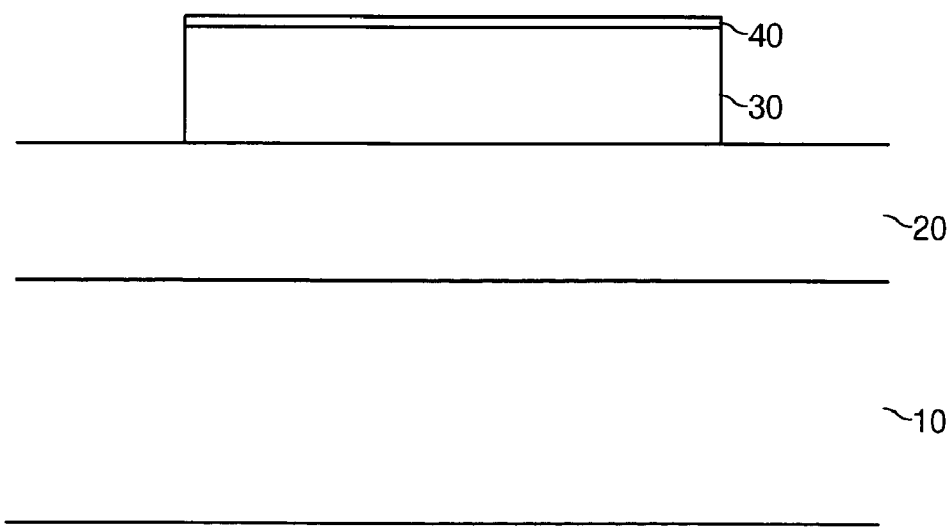
FIG. 2A to FIG. 2F are sectional views of a method of manufacturing a thin film capacitor according to a first embodiment of the present invention.
Figure 2B:
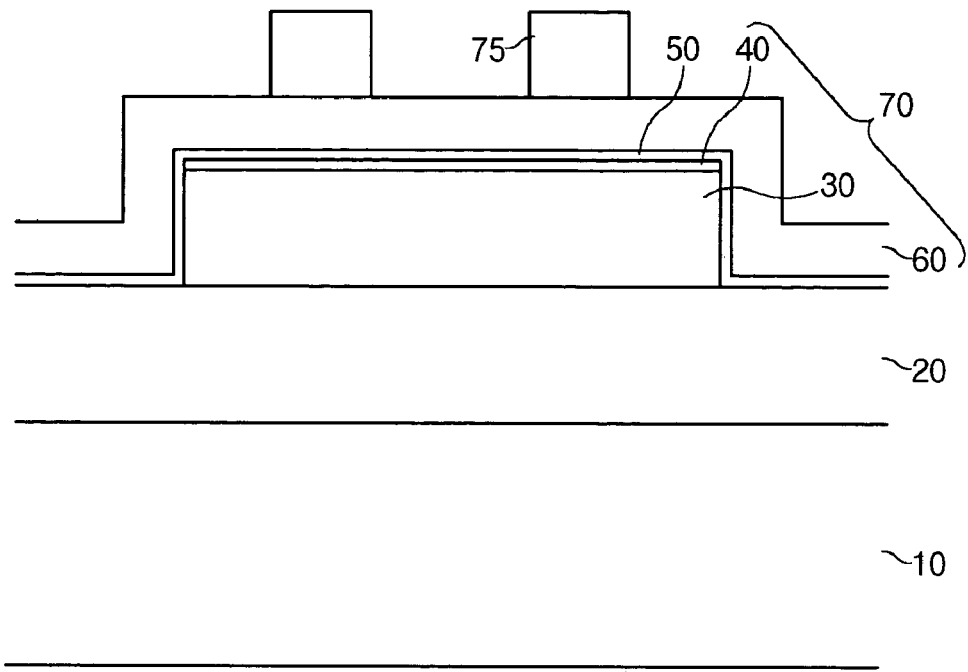
Figure 2C:
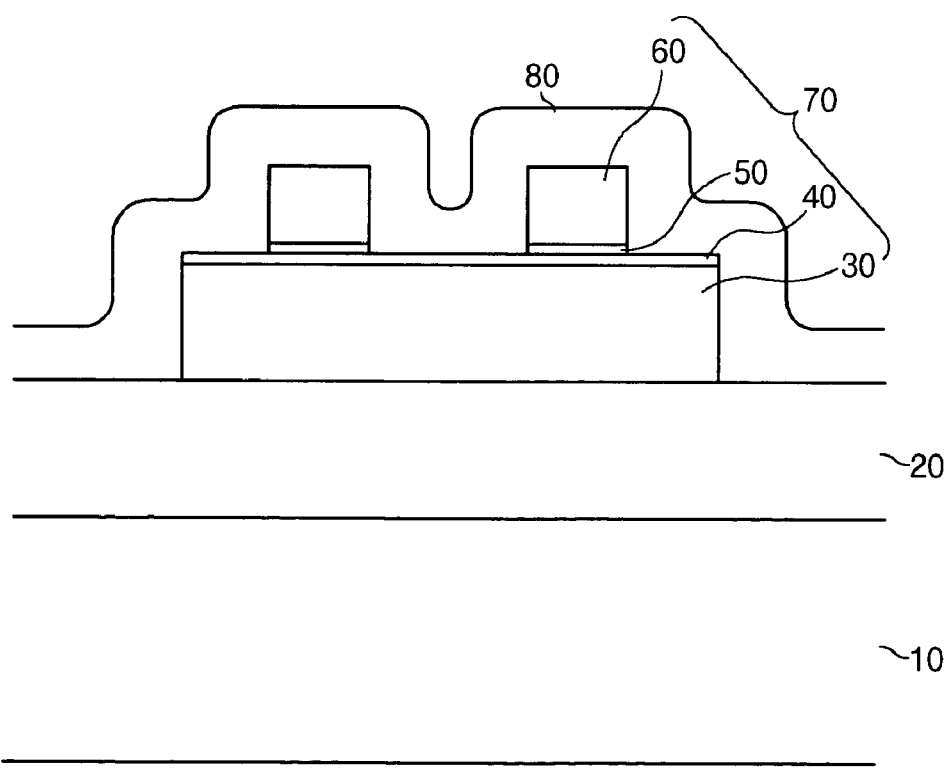
Figure 2D:
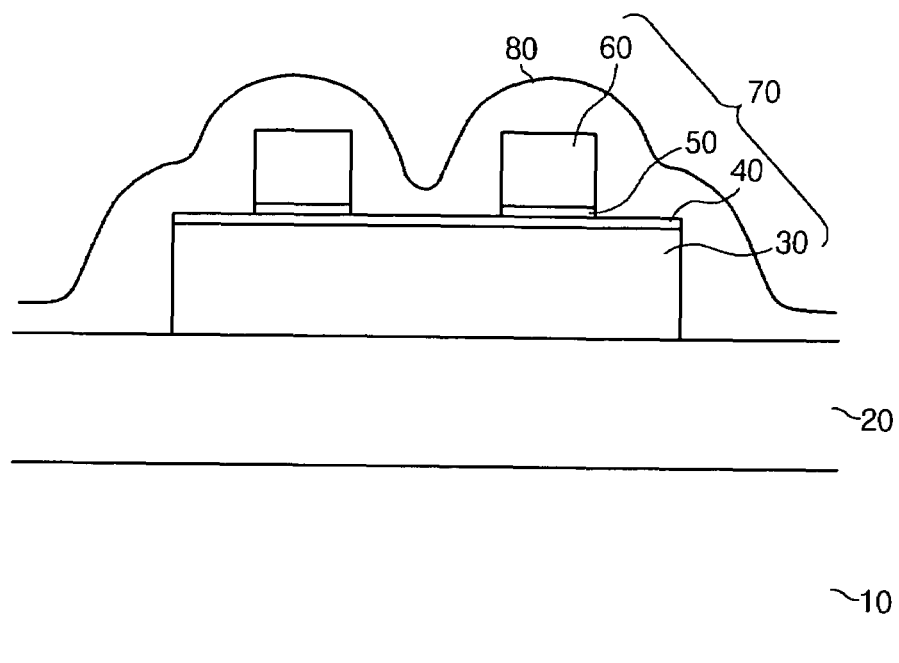
Figure 2E:
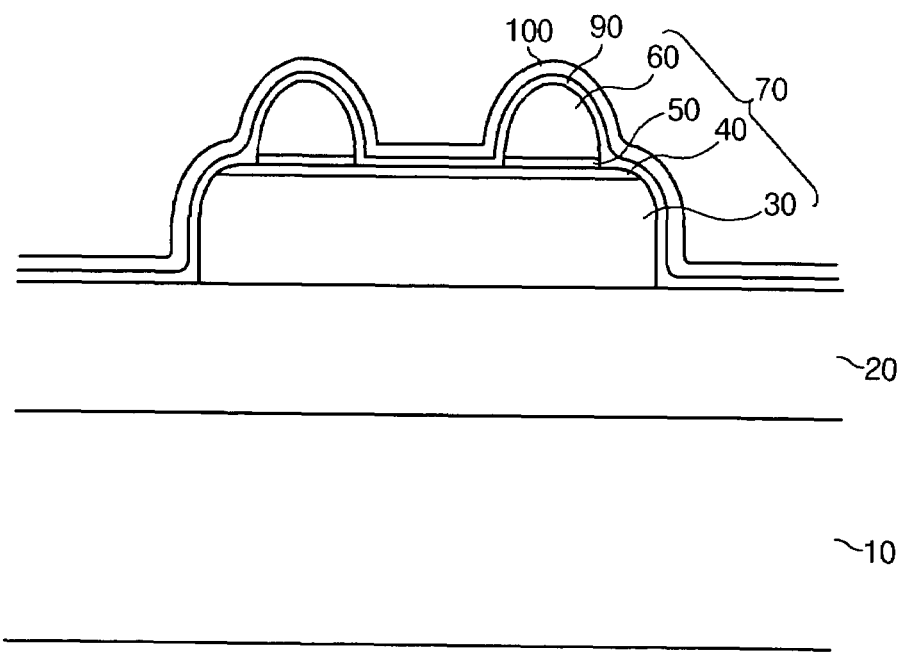
Figure 2F:
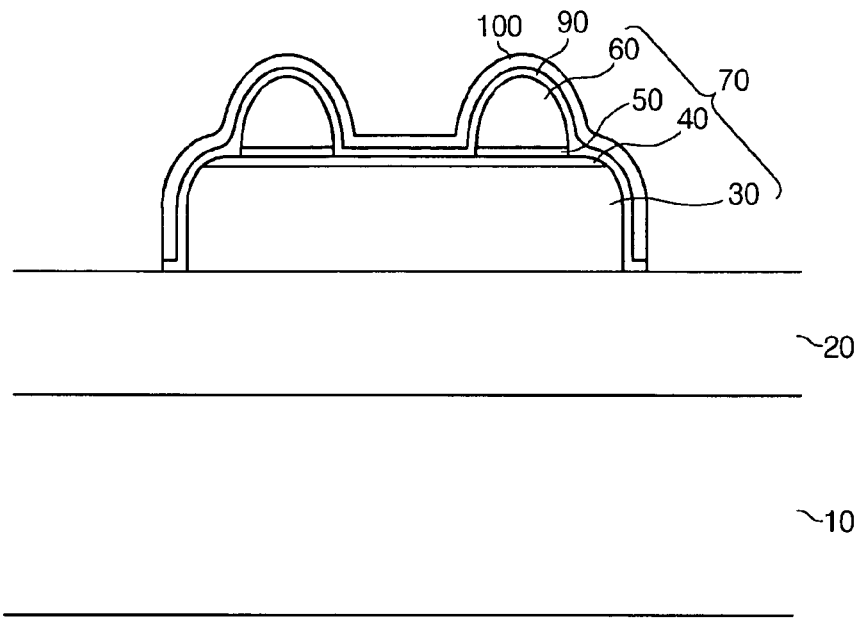
Figure 3A:
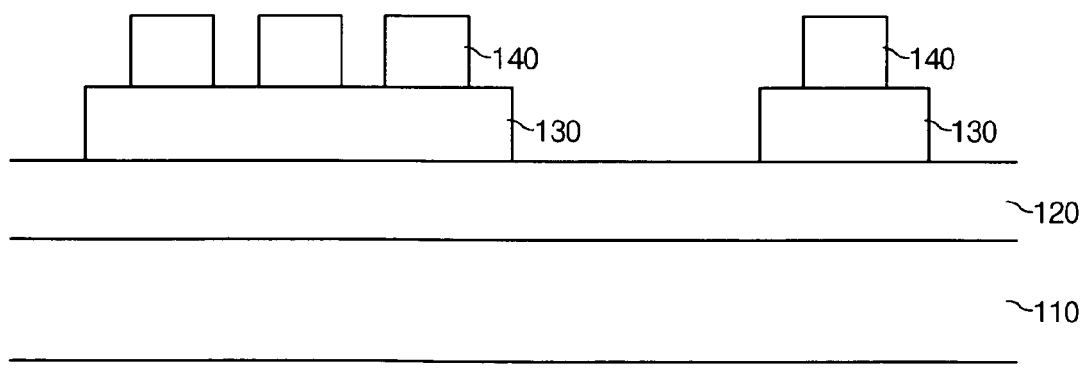
FIG. 3A to FIG. 3F are sectional views of a method of manufacturing a thin film capacitor according to a second embodiment of the present invention.
Figure 3B:
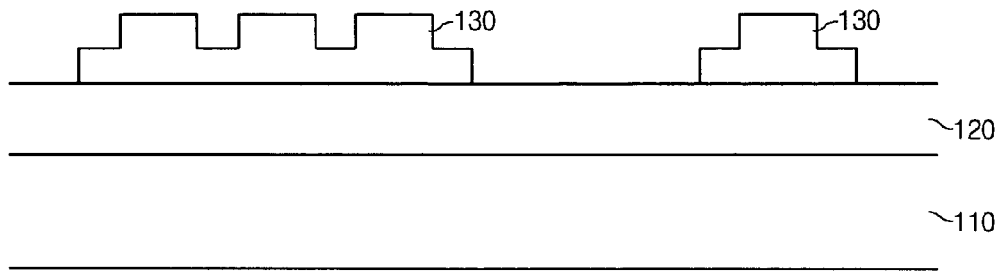
Figure 3C:
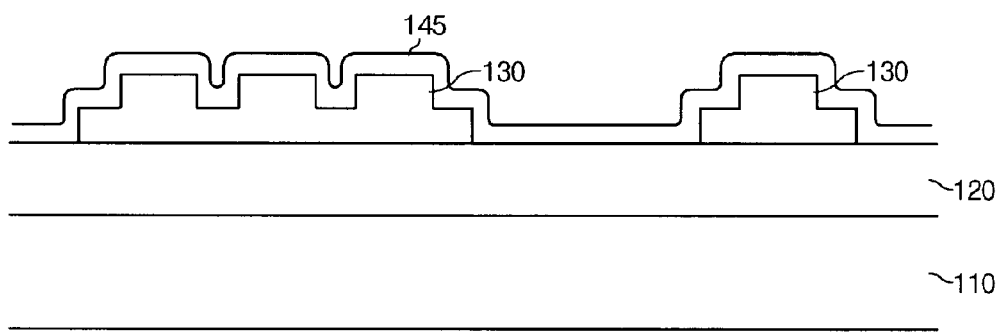
Figure 3D:
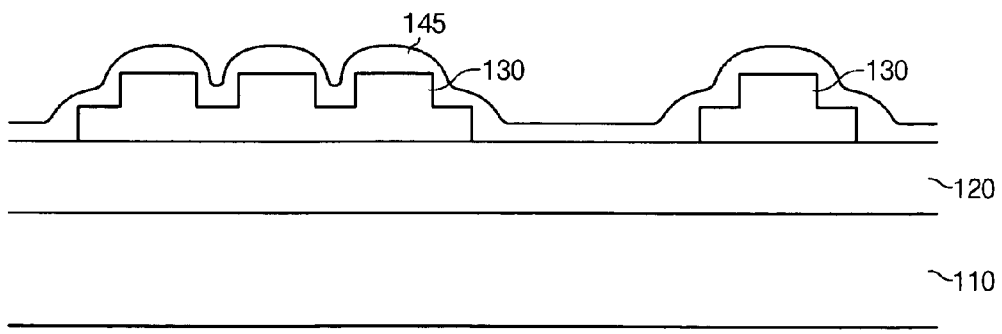
Figure 3E:
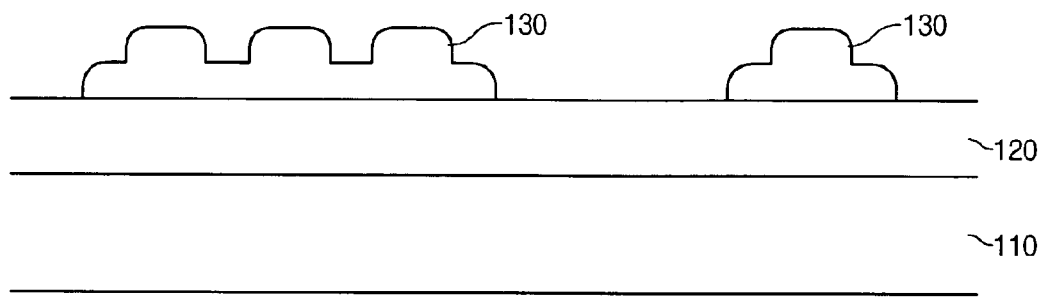
Figure 3F:
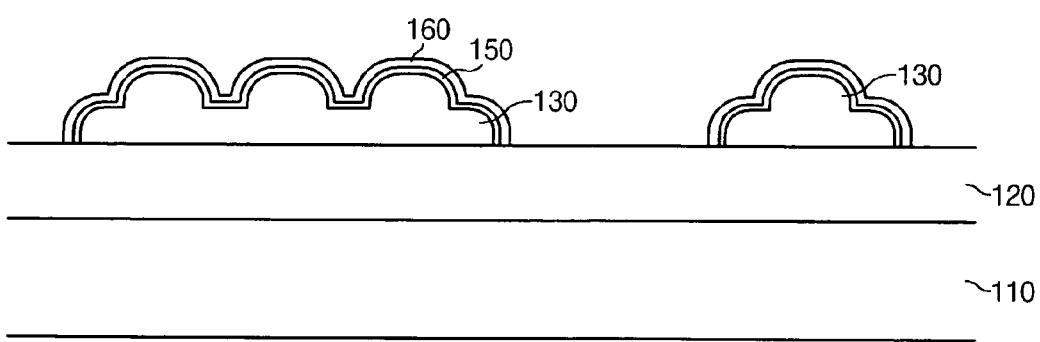

FIG. 2F describes a thin film capacitor manufactured by a method according to a first embodiment of the present invention, and FIG. 3F describes a thin film capacitor manufactured by a method according to a second embodiment of the present invention.

As shown in these drawings, thin film capacitors are generally on lower insulating layers 20 and 120, which are, in turn, on or over semiconductor substrates 10 and 110. The semiconductor substrates 10 and 110 may include other structures formed thereon. The structures may include individual devices (e.g., transistors, resistors, diodes, etc.). Furthermore, the MIM present capacitor is generally in a metallization layer that is on or over the polysilicon layer of such individual devices.

First electrode layers having protrusions and depressions on their surfaces are formed on the lower insulating layers 20 and 120, wherein the protrusions generally have a curved shape. Referring now to FIG. 2F, according to a first embodiment of the present invention, the first electrode layer may include a lower layer 30 having a flat upper surface, and an upper layer 60 projecting from parts of the upper surface of the lower layer 30 to form protrusions thereon. In this case, surfaces of the upper and lower layers 60 and 30 are curved; e.g., boundary regions or interfaces between respective upper surfaces and sidewalls are rounded. A liner metal layer 50 may be between the lower layer 30 and the upper layer 60. The liner metal layer 50 preferably comprises a metal having a different etch rate or selectivity from the lower layer 30 and the upper layer 60.

Referring now to FIG. 3F, in a second embodiment of the present invention, a first electrode layer 130 is unitary, and protrusions and depressions are on its surface, which are generally curved.

In the protrusions and depressions of the first electrode layer (e.g., including the lower and upper layers 30 and 60 in the first embodiment of FIG. 2F and/or the first electrode layer 130 of the second embodiment of FIG. 3F, widths of the depressions generally increase farther from the semiconductor substrate (e.g., the depressions have a width that generally decreases as a function of depression depth). Also, the first electrode layers may comprise a material selected from the group consisting of Al, Cu, an Al alloy (e.g., Al with up to 4 wt. % Cu), W, Ti, TiW alloy (e.g., about 30 mol % Ti and about 70 mol % W), Ta, TaN, Hf, and TiN (preferably Al, Cu, W, Ti, and TiN).

Dielectric layers 90 and 150 are generally on the respective first electrode layers, and form the curved exterior shape thereof. The dielectric layers 90 and 150 may comprise a material selected from the group consisting of $SiO_2$, $SiO_2$ doped with B (e.g., 1-5 wt. %) and/or P (e.g., 1-10 wt. %), $TiO_2$, $Al_2O_3$, and SiN. Preferably, dielectric layer 90 or 150 comprises $TiO_2$, $Al_2O_3$, or SiN.

Second electrode layers 100 and 160 are generally on the dielectric layers 90 and 150. Thus, an MIM thin film capacitor generally comprises the first and second electrode layers and the dielectric layer as described herein, where the first electrode may have an upper surface with protrusions thereon and/or depressions therein, and in which the protrusions and/or depressions may have a curved shape. The second electrode layers 100 and 160 may comprise a material selected from the group consisting of W, TiW alloy (as described above), Ru, Pt, and TiN (preferably Ru, Pt, and TiN), and may have substantially the same (or substantially complementary, if the second electrode layer fills the depressions in the first electrode layer and has a substantially flat upper surface, e.g., resulting from a planarization technique such as CMP) shapes of protrusions and depressions as the first electrode layer.

Hereinafter, a method of manufacturing the above-described thin film capacitor according to an embodiment of the present invention will be described in detail.

FIG. 2A to FIG. 2F are sectional views illustrating a thin film capacitor manufacturing method according to a first embodiment of the present invention, which will be hereinafter described in detail with reference thereto.

Firstly, as shown in FIG. 2A, by performing a conventional semiconductor device process on a semiconductor substrate, a semiconductor substrate structure 10 may contain individual devices, and a lower insulating layer 20 comprising an oxide such as PSG may be formed on the structure of the semiconductor substrate 10 (e.g., by blanket deposition). Then, the lower insulating layer 20 is generally planarized (e.g., by chemical mechanical polishing).

Subsequently, a lower layer 30, which is one layer of the first electrode layer, is formed on the lower insulating layer 20 (e.g., by a blanket deposition technique, such as sputtering or CVD) and is then patterned to have a predetermined width. An anti-reflective coating 40 may be formed on the lower layer 30 (e.g., by deposition), generally prior to patterning. The anti-reflective coating 40 generally comprises a conductive material that has antireflective properties (e.g., Ti, TiN, TiW alloy, etc.). It is preferable to form a liner metal layer 50 (refer to FIG. 2B) having a different etch selectivity from both the lower layer 30 and an upper layer 60 (which is formed in a later process) so as to act as an etch stop layer As shown in FIG. 2B, a liner metal layer 50 may be formed on the anti-reflective coating 40, the lower layer 30, and the lower insulating layer 20 (generally by a blanket deposition technique, such as sputtering or CVD). Then an upper layer 60, which is an additional layer that forms the protrusions of the first electrode layer, is formed on the liner metal layer 50. The upper layer 60 and the lower layer 30 may comprise a conductive material such as those described above (e.g., selected from the group consisting of Al, Cu, W, Ti, and TiN). Subsequently, a photoresist pattern 75 for a patterning process is formed on the upper layer 60 (e.g., by conventional photolithography).

Next, as shown in FIG. 2C, the upper layer 60 and the liner metal layer 50 are etched using the photoresist pattern 75 as a mask, so as to have a predetermined width. The anti-reflective coating 40 may be chosen such that it has a low etch rate relative to the etch rates of the upper layer 60 and the liner metal layer 50, so that it functions as an etch stop for this etching step. In this manner, the upper layer 60 protrudes from the upper surface of the lower layer 30. The combination of the upper and lower first electrode layers 60 and 30 may be configured as the first electrode layer of the present MIM capacitor structure. According to this configuration, the upper layer 60 corresponds to protrusions on the upper surface of the first electrode layer.

Subsequently, a sacrificial layer 80 which can be reflowed by heat is formed on the entire upper surfaces of the lower insulating layer 20 and the upper and lower first electrode layers 60 and 30, so as to enable the protrusions of the first electrode layer to be curved. The sacrificial layer 80 may comprise, for example, a photoresist.

Next, as shown in FIG. 2D, the sacrificial layer 80 is reflowed by heat treatment. When the sacrificial layer 80 comprises a photoresist, for example, the heat treatment may comprise heating at a temperature of 150-300° C. In the reflow process, the surface energy of the sacrificial layer 80 is reduced, and thus a slope of the surface becomes more gentle.

Next, as shown in FIG. 2E, the upper layer 60, the lower layer 30, and the reflowed sacrificial layer 80 are etched at (substantially) the same etch rate (e.g., one or more etch conditions are configured to provide substantially identical etch rates for the upper layer 60, the lower layer 30, and the reflowed sacrificial layer 80). The etching may be performed until the lower insulating layer 20 is exposed.

For example, the etching may comprise plasma etching at a pressure of 8-13 mTorr, a source power of 900-1200 W, a bias power of 900-1200 W, a flow rate of a chlorine source gas such as $Cl_2$ gas of 60-90 sccm, a flow rate of a boron source gas such as $BCl_3$ gas of 40-70 sccm, a flow rate of a carrier gas such as Ar gas of 30-50 sccm, and/or a flow rate of a fluorocarbon gas such as $CH_xF_y$ (where $y \geq 1$ and $x+y=4$; e.g., $CHF_3$ gas) of 2-5 sccm. In this manner, the surface of the upper layer 60 is generally curved, and thus, the spatial gaps in the upper layer 60 (namely, the width of the depressions) tend to increase the farther the distance from the semiconductor substrate 10. In addition, shoulders of the lower layer 30 protruding from the lower insulating layer 20 (namely, a boundary region between a top surface and a sidewall) may also be curved.

Next, and continuing to refer to FIG. 2E, a dielectric layer 90 is formed (e.g., by conformal deposition) on or above the entire area of the lower insulating layer 20 and the upper and lower first electrode layers 60 and 30, so as to cover the upper layer 60 and lower layer 30. On the dielectric layer 90, a second electrode layer 100 is formed. The dielectric layer 90 and the second electrode layer 100 are preferably formed on the first electrode layer 70 with a uniform thickness, such that the shapes of protrusions and depressions may be exteriorly shown almost exactly as they have been formed in the first electrode.

On the other hand, FIG. 3A to FIG. 3F are sectional views illustrating a thin film capacitor manufacturing method according to a second embodiment of the present invention, which will be hereinafter described in detail with reference thereto.

Firstly, as shown in FIG. 3A, a lower insulating layer 120 is formed on a semiconductor substrate structure 110, in the same manner as in the first embodiment of the present invention, and then the first electrode layer 130 is formed on the lower insulating layer 120. Subsequently, a photoresist pattern 140 is formed on the first electrode layer 130 to enable formation of the protrusions and depressions.

Next, as shown in FIG. 3B, the exposed first electrode layer 130 is etched to a certain depth, and then the photoresist pattern 140 is removed. The protrusions and depressions are etched to a depth less than a thickness of the first electrode layer 130 (e.g., from 25% to 75% of the first electrode layer 130).

Next, as shown in FIG. 3C, a sacrificial layer 145 which can be reflowed by heat is formed on or above the entire upper surface of the first electrode layer 130.

Next, as shown in FIG. 3D, the sacrificial layer 145 is reflowed by heat treatment.

Next, as shown in FIG. 3E, the sacrificial layer 145 and the first electrode layer 130 are etched under conditions providing substantially the same etch rates (e.g., substantially identical etch rates for the sacrificial layer 145 and the first electrode layer 130), and thus the first electrode layer 130 generally has curved protrusions and/or depressions on its surface.

Next, as shown in FIG. 3F, a dielectric layer 150 and a second electrode layer 160 are formed on the first electrode layer 130 (e.g., by a conformal deposition technique, such as CVD), and thus a capacitor having an MIM structure is manufactured.

As described above, according to a thin film capacitor of an MIM structure according to embodiments of the present invention, capacitance can be increased using a lateral side of the electrode, because the second electrode layer may cover portions of lateral sides of the first electrode protrusions and/or depressions, as well as the upper surface thereof. In addition, since the first electrode layer is generally curved and has protrusions and depressions on its surface, capacitance is increased according to an increase of area. Accordingly, by increasing the capacitance without increasing a width of the electrode, a thin film capacitor having high capacitance which is advantageous for higher integration may be achieved.

According to an embodiment of the present invention, a material that is reflowable by heat treatment (for example, a photoresist) is reflowed after coating on an electrode layer, and then the reflowed photoresist and the electrode layer thereunder are etched together such that the electrode layer may have the same outline or profile as the reflowed photoresist. In such a manner, an exterior surface of the electrode layer may be easily formed to have curved protrusions and depressions.

According to the prior art, a short circuit may be problematically caused since a lower electrode may be etched when the dielectric layer when the dielectric layer is (over)etched, and then re-deposited to sidewalls of the dielectric layer and the upper electrode. However, the present invention reduces or prevents such short circuits.

In addition, the fringe (or side surface-based) capacitance is considered when designing the present capacitor, and therefore deterioration of the characteristics of the capacitance caused by fringe or sidewall capacitance may be prevented.

In addition, the step coverage when depositing the dielectric layer and the second electrode layer may be improved and the manufacturing process stabilized, by forming a curved upper surface on the first electrode layer and/or forming depressions having a depression width (i.e., distance between adjacent protrusions) that increases the farther from the semiconductor substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a thin film capacitor, comprising:
   forming a first electrode layer having protrusions and depressions on its surface, on a lower insulating layer on a semiconductor substrate;
   forming a sacrificial layer on the first electrode layer with a material that is reflowable when heated;
   reflowing the sacrificial layer by heat treatment;
   etching the reflowed sacrificial layer and first electrode layer so that the protrusions of the first electrode layer are curved; and
   sequentially forming a dielectric layer and a second electrode layer on the first electrode layer.

2. The method of claim 1, wherein
   the sacrificial layer comprises a photoresist, and
   the heat treatment comprises heating at a temperature of 150-300° C.

3. The method of claim 1, wherein
   the etching is performed such that the sacrificial layer and the first electrode layer are etched at about the same etch rate.

4. The method of claim 1, wherein
   the etching comprises plasma etching at a pressure of 8-13 mTorr, a source power of 900-1200 W, a bias power of 140-200 W, a flow rate of $Cl_2$ gas of 60-90 sccm, a flow rate of $BCl_3$ gas of 40-70 sccm, a flow rate of Ar gas of 30-50 sccm, and a flow rate of $CHF_3$ gas of 2-5 sccm.

5. The method of claim 3 wherein
   the etching comprises plasma etching at a pressure of 8-13 mTorr, a source power of 900-1200 W, a bias power of 140-200 W, a flow rate of $Cl_2$ gas of 60-90 sccm, a flow rate of $BCl_3$ gas of 40-70 sccm, a flow rate of Ar gas of 30-50 sccm, and a flow rate of $CHF_3$ gas of 2-5 sccm.

6. The method of claim 1, wherein forming the first electrode layer comprises:
   forming the first electrode layer on the lower insulating layer such that the first electrode layer has a thickness; and
   selectively etching portions of the first electrode to form protrusions and depressions thereon to a depth less than the thickness of the first electrode layer.

7. The method of claim 1, wherein forming the first electrode layer comprises:
   sequentially forming a lower first electrode layer and an upper first electrode layer on the semiconductor substrate; and
   selectively etching portions of the upper first electrode layer until portions of the lower first electrode layer are exposed, such that the non-etched portions of the upper first electrode layer protrude from unexposed areas of the lower first electrode layer.

8. The method of claim 7, further comprising:
   forming a liner metal layer on the lower first electrode layer and the lower insulating layer after the lower first electrode layer is formed, and
   forming the upper first electrode layer on the liner metal layer.

9. The method of claim 1, wherein
   the first electrode layer comprises a material selected from the group consisting of Al, Cu, W, Ti, and TiN.

10. The method of claim 1, wherein
    forming the dielectric layer comprises conformally depositing the dielectric layer, and the dielectric layer comprises a material selected from the group consisting of $TiO_2$, $Al_2O_3$, and SiN.

11. The method of claim 1, wherein
    forming the second electrode layer comprises conformally depositing the second electrode layer, and the second electrode layer comprises a material selected from the group consisting of Ru, Pt, and TiN, and is formed to show the surface shape of.

12. The method of claim 1, wherein
    the etching comprises reducing a chamber pressure, applying a source power and a bias power to a plasma etching apparatus, and plasma etching the sacrificial layer and the first electrode layer using a chlorine source gas, a boron source gas, and a fluorocarbon source gas.

13. The method of claim 12, wherein
    the etching further comprises plasma etching the sacrificial layer and the first electrode layer using an inert gas.

14. The method of claim 12, wherein the chlorine source gas comprises $Cl_2$, the boron source gas comprises $BCl_3$, and the fluorocarbon source gas comprises $CH_xF_y$, where $y \geq 1$ and $x+y=4$.

15. A method of manufacturing a thin film capacitor, comprising:
    forming a first electrode layer having protrusions and depressions on its surface, on a lower insulating layer on a semiconductor substrate;
    forming a reflowable sacrificial layer on the first electrode layer;
    reflowing the sacrificial layer;
    removing the reflowed sacrificial layer and portions of the first electrode layer to curve the protrusions on the surface of the first electrode layer; and
    sequentially forming a dielectric layer and a second electrode layer on the first electrode layer.

* * * * *